US005918128A

United States Patent [19]
Gardner et al.

[11] Patent Number: 5,918,128
[45] Date of Patent: Jun. 29, 1999

[54] REDUCED CHANNEL LENGTH FOR A HIGH PERFORMANCE CMOS TRANSISTOR

[75] Inventors: Mark I. Gardner, Cedar Creek; John J. Bush, Leander, both of Tex.

[73] Assignee: Advanced Micro Devices, Inc.

[21] Appl. No.: 09/093,423

[22] Filed: Jun. 8, 1998

[51] Int. Cl.$^6$ .................................................. H01L 21/336
[52] U.S. Cl. ........................ 438/286; 438/494; 438/498
[58] Field of Search .................................. 438/179, 231, 438/286, 494, 498, 585, 721, 733, 734, 735, 739, FOR 175, FOR 190, FOR 385

[56] References Cited

U.S. PATENT DOCUMENTS

| | | | |
|---|---|---|---|
| 5,036,017 | 7/1991 | Noda | 438/179 |
| 5,580,804 | 12/1996 | Joh | 438/231 |
| 5,654,215 | 8/1997 | Gardner et al. | 438/286 |
| 5,656,518 | 8/1997 | Gardner et al. | 438/286 |
| 5,672,531 | 9/1997 | Gardner et al. | 438/286 |
| 5,801,088 | 9/1998 | Gardner et al. | 438/585 |

*Primary Examiner*—Richard A. Booth
*Assistant Examiner*—Christopher Lattin
*Attorney, Agent, or Firm*—Kevin L. Daffer; Conley, Rose & Tayon

[57] ABSTRACT

An integrated circuit fabrication process is provided in which a transistor having an ultra short channel length is formed by multiple etchings of a gate conductor layer. After formation of the gate conductor using a photolithographic process, the lateral length of the gate conductor is reduced by forming a masking layer upon the gate conductor such that only a portion of the gate conductor is covered by the masking layer. The unmasked portion of the gate conductor is then removed to reduce the lateral length of the gate conductor. In this manner, a gate conductor having a lateral length that is significantly less than a lateral length attainable using a photolithographic process may be obtained.

19 Claims, 4 Drawing Sheets

REDUCED CHANNEL LENGTH FOR A HIGH PERFORMANCE CMOS TRANSISTOR

BACKGROUND OF THE INVENTION

1. Field of the Invention

This invention relates to integrated circuit fabrication and, more particularly, to forming a transistor having an ultra short channel length dictated by multiple etchings of a gate conductor layer.

2. Description of the Relevant Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions (i.e., junctions) adjacent to and on opposite sides of the gate conductor within the substrate. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

Because of the increased desire to build faster and more complex integrated circuits, it has become necessary to reduce the transistor threshold voltage, $V_T$. Several factors contribute to $V_T$, one of which is the effective channel length ("Leff") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length decreases, so too must the Leff. Decreasing Leff reduces the distance between the depletion regions associated with the source and drain of a transistor. As a result, less gate charge is required to invert the channel of a transistor having a shorter Leff. Accordingly, reducing the physical channel length, and hence the Leff, can lead to a reduction in the threshold voltage of a transistor. Consequently, the switching speed of the logic gates of an integrated circuit employing transistors with reduced Leff is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as lithography is used to pattern a photosensitive film (i.e., photoresist) above the polysilicon material. An optical image is transferred to the photoresist by projecting a form of radiation, typically ultraviolet light, through the transparent portions of a mask plate. The solubility of photoresist regions exposed to the radiation is altered by a photochemical reaction. The photoresist is washed with a solvent that preferentially removes resist areas of higher solubility. Those exposed portions of the polysilicon material not protected by photoresist are etched away, defining the geometric shape of the opposed sidewall surfaces of a polysilicon gate conductor.

The lateral length (i.e., the distance between opposed sidewall surfaces) of the gate conductor which dictates the physical channel length of a transistor is thus defined by the lateral length of an overlying photoresist layer. The minimum lateral dimension that can be achieved for a patterned photoresist layer is limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, scattering the radiation and therefore adversely affecting the resolution of the optical system. As such, the features patterned from a masking plate may be skewed, enlarged, shortened, warped, or otherwise incorrectly printed onto the photoresist.

It would therefore be desirable to develop a transistor fabrication technique in which the channel length of the transistor is reduced to provide for high frequency operation of an integrated circuit employing the transistor. More specifically, a process is needed in which the channel length is no longer dictated by the resolution of a lithography optical aligner. It would further be desirable that the lateral length of a gate conductor, which defines the channel length of a transistor, is no longer determined by an image printed onto photoresist. Techniques that rely on photolithography to define the lateral length of the gate conductor may cause the dimensions of the gate conductor to be altered from design specifications due to resolution problems. A process which avoids the limitations of lithographic exposure used for defining opposed sidewalls (i.e., boundaries) of conventional gate conductors would beneficially allow the channel length, and hence the Leff, of a transistor to be scaled to a smaller size. Minimizing the Leff of a transistor would advantageously increase the speed at which the logic gates of a transistor switch between its on and off states.

SUMMARY OF INVENTION

The problems outlined above are in large part solved by the techniques hereof for forming a transistor in which the channel length is dictated by multiple etchings of a gate conductor layer. Generally, a gate conductor is formed from a gate conductor layer using photolithographic techniques. The lateral length of the gate conductor is reduced by forming another masking layer upon the gate conductor such that only a portion of the gate conductor is covered by the masking layer. The unmasked portion of the gate conductor is then entirely removed to reduce the lateral length of the gate conductor. In this manner, a gate conductor is obtained having a lateral length that is significantly less than a lateral length attainable using a photolithographic process.

In one embodiment, a semiconductor substrate, which includes a gate dielectric layer and a gate conductor layer, is provided. A photoresist layer is patterned using well-known lithography techniques to expose portions of the gate conductor layer. The exposed portions of the gate conductor layer are removed to form the gate conductor.

A masking layer is preferably patterned over the gate conductor such that only a portion of the gate conductor is covered by the masking layer. The lateral length of the masked portion of the gate conductor may be less than a lateral length obtainable using a photolithographic system. The masking layer also covers only one junction of a pair of junctions flanking the gate conductor. Preferably, only the drain is covered, leaving the source exposed.

The masking layer may be etched such that the lateral length of the masking layer, which is herein defined as the length of the masking layer from a sidewall of the gate conductor to the sidewall of the masking layer, is reduced. More specifically, the masking layer height and, more importantly, the distance at which the masking layer extends across the gate conductor width is reduced. In effect, reducing the masking layer perpendicular to the axis along which the gate conductor extends, allows a portion of the gate conductor extending along its length to be exposed. The masking layer is preferably subjected to an isotropic etch in which horizontal and vertical surfaces of the masking layer are removed at substantially the same rate. In this manner, both the height and lateral length of the masking structure may be reduced.

After the lateral length of the masking structure has been reduced, the exposed portions of the gate conductor are removed. An anisotropic etch is preferably used to etch the gate conductor. The gate conductor is preferably etched down to the gate dielectric layer. As a result of this etching process the lateral width of the gate conductor is reduced, leading to a reduction in the channel "length" beneath the remaining gate conductor.

The reduction of the lateral width of the gate conductor allows the formation of a transistor having a channel length which may be less than a channel length of a transistor formed at the optical resolution of the photolithographic equipment. For example, if the gate conductor is initially formed at the optical resolution limit of the photolithographic equipment, the subsequent formation of a masking layer over a portion of the gate conductor preferably allows the gate conductor to be etched to a surface area less than the optical resolution of the photolithographic equipment. An advantage of this process is that the density of transistors in an integrated circuit may be increased by using these reduced-length transistors.

While the masking layer remains covering the gate conductor and drain region, a source implant is forwarded into semiconductor substrate to form the source region. The remaining, i.e., shortened gate conductor masks the source implant from entering the channel region. The source implant is also inhibited from entering drain region by the masking layer.

After forming the source region, the masking layer is removed. After removal of the masking layer, an LDD implant is preferably forwarded into the semiconductor substrate to form an LDD area exclusively within the drain region. After formation of the drain region LDD area, spacer structures are formed adjacent to the sidewalls of the gate conductor. Once the spacer structures are in place, a drain implant is preferably forwarded into the semiconductor substrate to complete the drain region.

An advantage of this process is that a transistor having an asymmetric LDD structure may be formed. Beneficially, the LDD implant forms a graded junction only in the critical drain area. Hot carrier effects, or hot carrier injection ("HCI") is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel.

Using the n-channel (i.e., NMOS) example, the electric field at the drain causes channel electrons to gain kinetic energy. Electron-electron scattering randomizes the kinetic energy and the electrons become "hot ". Some of these hot electrons have enough energy to create electron-hole pairs through impact ionization of the silicon atoms. Electrons generated by impact ionization join the flow of channel electrons, while the holes flow into the bulk to produce a substrate current in the device. The substrate current is the first indication of the creation of hot carriers in a device. For p-channel devices, the fundamentals of the process are essentially the same except that the role of holes and electrons are reversed.

HCI occurs when some of the hot carriers are injected into the gate oxide near the drain junction, where they induce damage and become trapped. Traps within the gate oxide generally become electron traps, even if they are initially filled with holes. As a result, there is a negative charge density in the gate oxide. The trapped charge accumulates with time, resulting in positive threshold shifts in both n-channel and p-channel devices. It is know that since hot electrons are more mobile than hot holes. Hot carrier injection causes a greater threshold skew in n-channel devices than p-channel devices. Nonetheless, a p-channel device will undergo negative threshold skew if its Leff is less than, e.g., 0.8 $\mu$m.

A properly defined LDD structure must be one which minimizes HCI but not at the expense of excessive source/drain resistance. The addition of an LDD implant adjacent the channel unfortunately adds resistance to the source/drain path. This added resistance, generally known as parasitic resistance, can have many deleterious effects. First, parasitic resistance can decrease the saturation current (i.e., current above threshold). Second, parasitic resistance can decrease the overall speed of the transistor.

The deleterious effects of decreasing saturation current and transistor speed is best explained in reference to a transistor having a source resistance and a drain resistance. The source and drain parasitic resistances are compounded by the presence of the conventional source and drain LDDS. Using a n-channel example, the drain resistance RD causes the gate edge near the drain to "see " a voltage less than VDD, to which the drain is typically connected. Similarly, the source resistance $R_S$, causes the gate edge near the source to see some voltage more than ground. As far as the transistor is concerned, its drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT} = K/2 * (V_{GS} - V_T)^2$$

where $I_{DSAT}$ is saturation current, K is a value derived as a function of the process parameters used in producing the transistor, and $V_T$ is the threshold voltage. Reducing or eliminating $R_S$, would therefore draw the source voltage closer to ground, and thereby increasing the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCI control. Accordingly, substantial LDD is required in the drain area. It would therefore seem beneficial to decrease $R_S$ rather than $R_D$. This implies the need for a process for decreasing $R_S$ (source-side LDD area) while maintaining $R_D$ (drain-side LDD area).

Proper LDD design must take into account the need for minimizing parasitic resistance $R_S$ at the source side while at the same time attenuating Em at the drain-side of the channel. Further, proper LDD design requires that the injection position associated with the maximum electric field Em be located under the gate conductor edge, preferably well below the silicon surface. The present LDD design involves an LDD implant aligned with the gate conductor but only in the drain side, the effect of which is to diffuse Em only in the critical drain area. The ensuing transistor is applicable to either n-channel or p-channel transistors formed using a combination of photolithography followed by a selective etch. Parasitic resistance in the non-critical source side is reduced since the source area does not yield a graded junction.

Figure 1:
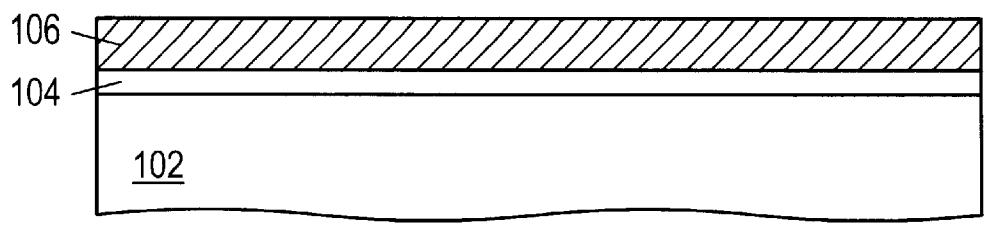
FIG. 1 is a partial cross-sectional view of a semiconductor substrate upon which a gate dielectric layer and a gate conductor layer are formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but, on the contrary, the intention is to cover all modifications, equivalents, and alternatives falling within the spirit and scope of the present invention as defined by the appended claims.

DETAILED DESCRIPTION OF THE INVENTION

FIGS. 1–12 illustrate the formation of a transistor according to one embodiment of the present invention. Turning to FIG. 1, a semiconductor substrate 102, preferably composed of single crystalline silicon, is depicted, upon which a gate dielectric 104 is formed. Substrate 102 is slightly doped with p-type or n-type dopant species. In an alternate embodiment, p-type or n-type wells may be arranged within select regions of substrate 102 to allow for the formation of a CMOS integrated circuit which includes both NMOSFET and PMOSFET transistors. Although not shown in the depicted crosssection of substrate 102, dielectric isolation regions, such as trench isolation structures, may be arranged spaced distances apart within the substrate for dielectrically isolating the ensuing active areas. Deposited entirely across substrate 122 is a dielectric layer 124. The dielectric 124 is either deposited or grown from a heated, oxygen bearing source. Gate dielectric 124 is preferably formed in a thermal oxidation furnace using temperatures of approximately 700° to 900° C. for a relatively short time (e.g., less than 60 minutes). It is preferred that gate dielectric 124 be grown to a thickness of approximately 15–200 angstroms. Gate dielectric 14 is not limited to thermally grown oxide and may be other materials, such as barium strontium titanate or cerium oxide.

Deposited upon oxide 104 is a gate conductor layer 106. Gate conductor layer 106 is preferably made of polycrystalline silicon which will later be rendered conductive by a subsequent implanting step. The gate conductor layer 106 is preferably deposited using a low pressure chemical vapor deposition ("CVD") process. The gate conductor layer 106 is preferably deposited to a thickness of approximately 1000 to 1500 angstroms. The upper surface of the gate conductor layer 106 may then be polished using e.g., mechanical polishing or chemical-mechanical polishing to substantially reduce its surface roughness. As a result, the thickness of gate conductor layer 106 may be reduced by about 50 angstroms to a uniform thickness across the dielectric surface.

Figure 2:
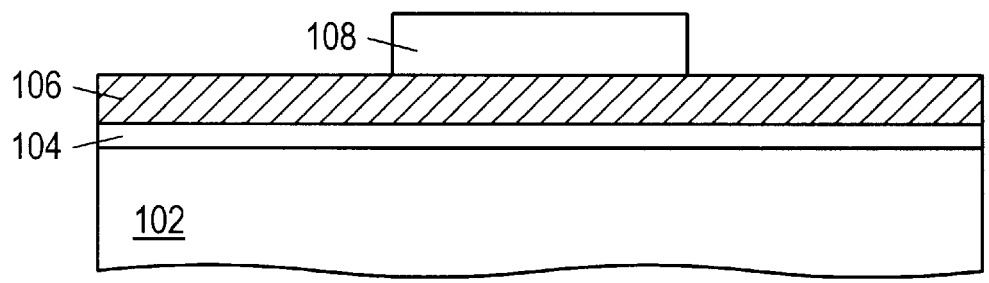
FIG. 2 is a processing step subsequent to FIG. 1, in which a patterned photoresist layer is formed over the gate conductor layer.
Figure 3:
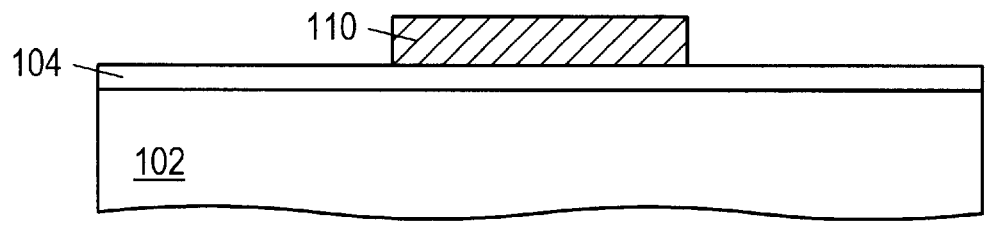
FIG. 3 is a processing step subsequent to FIG. 2, in which portions of the gate conductor layer are removed such that a gate conductor is formed upon the gate dielectric layer.

FIG. 2 illustrates deposition and selective removal of a photoresist layer 108. Photoresist layer 108 is patterned using well-known lithography techniques to expose portions of the gate conductor layer 106. The exposed portions of gate conductor layer 106 not covered by photoresist layer 108 are removed to form gate conductor 110, as depicted in FIG. 3. Removal of the exposed portions of gate conductor layer 106 is preferably accomplished by etching. An etchant is chosen which is selective to removing the gate conductor layer 106 but not the developed photoresist material 108, e.g., a dry, plasma etch. Etching is preferably continued until the gate dielectric layer 104 is reached.

Figure 4:
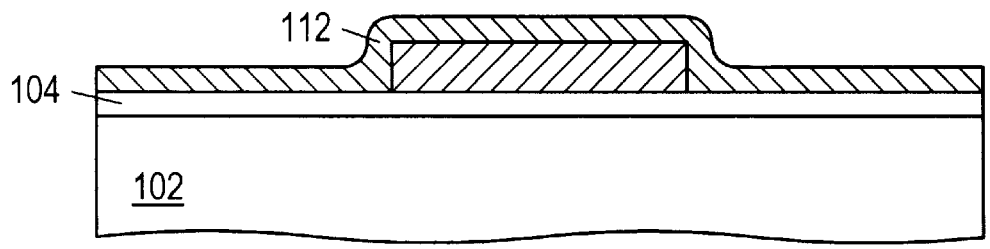
FIG. 4 is a processing step subsequent to FIG. 3, in which a silicon oxynitride layer is formed over the semiconductor substrate.

After formation of gate conductor 110, a conformal silicon oxynitride layer 112 may be formed over the semiconductor substrate, as depicted in FIG. 4. The silicon oxynitride deposition may be performed using a CVD reactor. The silicon oxynitride layer 112 may serve to prevent native oxide growth in regions absent photoresist. The nitride also provides selective removal of overlying non-nitride based materials from the oxynitride, or selective removal of oxynitride from underlying non-nitride based materials. Thus, the oxynitride serves as an etch stop and allows it to be selectively removed at a much higher etch rate than the underlying silicon substrate.

Figure 5:
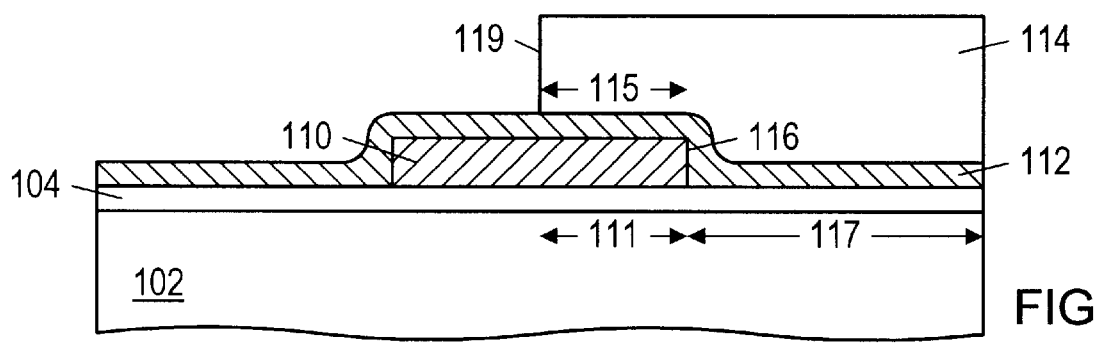
FIG. 5 is a processing step subsequent to FIG. 4, in which a masking layer is formed over a portion of the gate conductor.

FIG. 5 depicts a patterned masking layer 114 formed over silicon oxynitride layer 112. Preferably, masking layer 114 comprises photoresist which may be patterned using optical lithography. Masking layer 114 may also be composed of a material other than photoresist, e.g., oxide, as long as the material is dissimilar from the oxynitride and gate conductor material. If masking layer 114 is not photoresist, it may be formed using both lithography and an etch technique, e.g., a dry, plasma etch. Masking layer 114 is preferably patterned such that only a portion 111 of gate conductor 110 lies below the masking layer. The lateral length of portion 111 of gate conductor 110 which lies below masking layer 114 may be less than a lateral length obtainable using a photolithographic system. Masking layer is also patterned such that drain region 117 of the semiconductor substrate is also covered.

Figure 6:
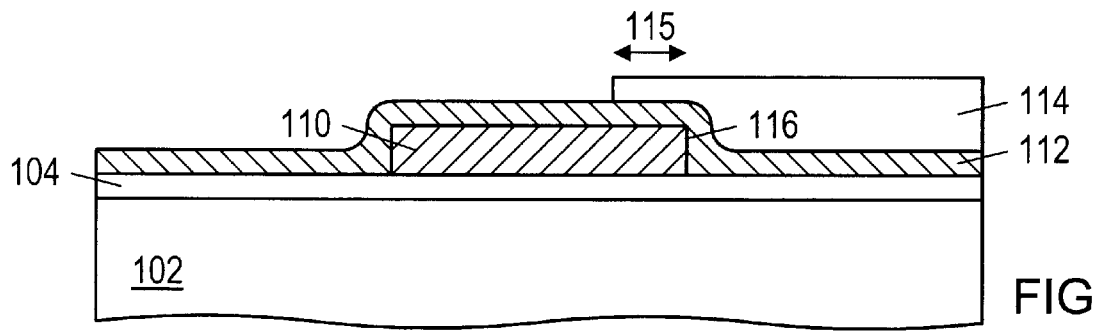
FIG. 6 is a processing step subsequent to FIG. 5, in which the masking layer is partially removed such that the portion of the gate conductor covered by the masking layer is reduced.

After the formation of masking layer 114, the masking layer may be etched as shown in FIG. 6 such that the lateral length 115 of the masking layer, which is herein defined as the length of the masking layer of the masking layer 114 from sidewall 116 of gate conductor 110 to sidewall 119 of masking layer 114. The masking layer 114 is preferably subjected to an isotropic etch in which horizontal and vertical surfaces of masking layer 114 are removed at substantially the same rate. In this manner, both the height and lateral length of the masking structure may be reduced. The etch is terminated after a select lateral amount of masking structure 114 is removed.

Figure 7:
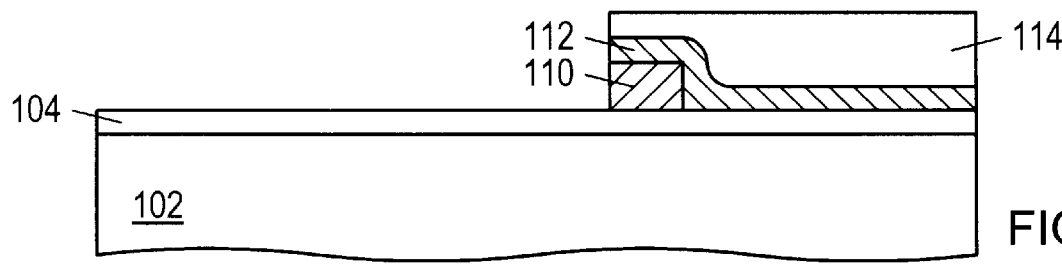
FIG. 7 is a processing step subsequent to FIG. 6, in which a lateral length of the gate conductor is reduced.
Figure 8:
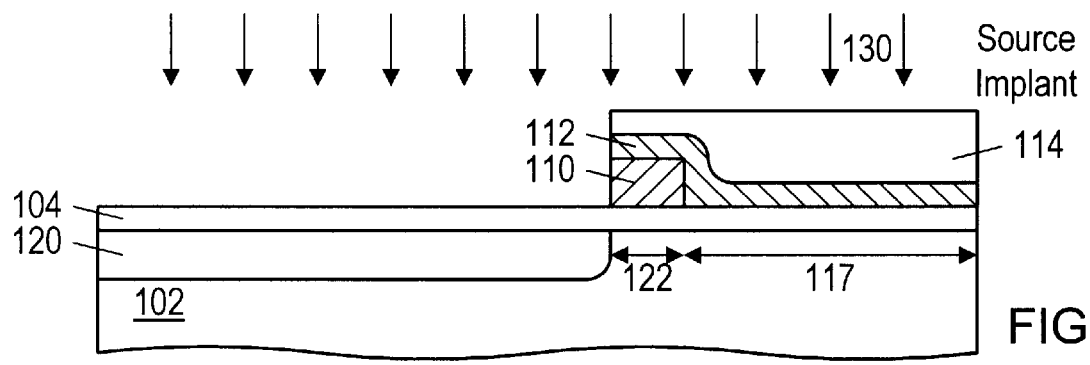
FIG. 8 is a processing step subsequent to FIG. 7, in which a source region is formed in an unmasked portion of the semiconductor substrate.

After the lateral length of the masking structure has been reduced, the exposed portions of the silicon oxynitride layer are removed. Preferably, removal is achieved by a wet etch process. The process conditions are chosen such that the silicon oxynitride layer is removed with high selectivity against removal of the underlying oxide layer 104, masking layer 114, and gate conductor 110. The masking layer 114 together with the remaining silicon oxynitride layer 112 are preferably used as a mask to reduce the lateral length of gate conductor 110, as depicted in FIG. 7. An anisotropic etch in which ion ablation of gate conductor 110 occurs at a faster rate in a vertical direction than in a horizontal direction may be used. A plasma may be generated from a gas bearing fluorine- and chlorine-containing molecules (e.g., $SF_6$ and $Cl_2$) to provide for an anisotropic etch which is highly selective to the gate conductor material (e.g., polysilicon). Gate conductor 110 is preferably etched down to the gate dielectric layer 104. Etching conditions are preferably chosen such that gate dielectric layer 104 remains substantially unetched after etching of gate conductor 110 is completed. As a result of this etching process the lateral length of gate conductor 110 is preferably reduced.

The reduction of the lateral length of the gate conductor allows the formation of a transistor having a channel length which may be less than the optical resolution of the photolithographic equipment. For example, if the gate conductor is initially formed at the optical resolution limit of the photolithographic equipment, the subsequent formation of a masking layer over a portion of the gate conductor preferably allows the gate conductor to be etched to a length below the optical resolution of the photolithographic equipment. An advantage of this process is that the density of transistors in an integrated circuit may be increased by using these reduced-length transistors.

While the masking layer 114 and silicon oxynitride layer 112 remain covering gate conductor 110 and drain region 117, source implant 130 is forwarded into semiconductor substrate 102 to form source region 120. If a PMOS integrated circuit is being formed, ion implantation of p-type impurities is preferably performed. If an NMOS integrated circuit is being formed, ion implantation of n-type impurities is preferably performed. Gate conductor 110 preferably masks the source implant from channel region 122. The source implant is also inhibited from entering drain region 117. Both masking layer 114 and silicon oxynitride 112 layer serve to inhibit ion implantation within the drain region. The use of a combination of the two layers is preferred since the high energies used to form the source region may be sufficient to drive through masking layer 114.

Figure 9:
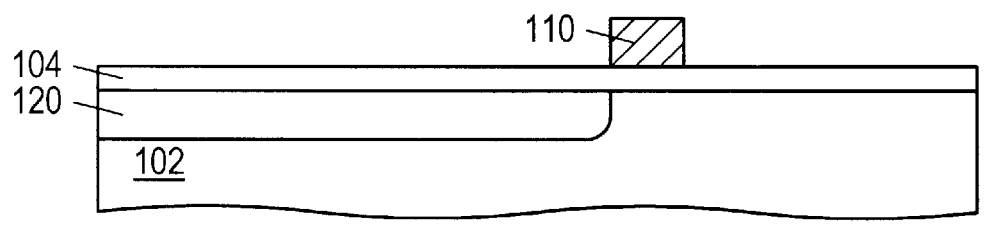
FIG. 9 is a processing step subsequent to FIG. 8, in which the masking layer and the silicon oxynitride layer are removed.

After formation of source region 120, masking layer 114 and silicon oxynitride layer 112 are preferably removed, as depicted in FIG. 9. The removal of the two layers may be performed in a stepwise manner, or concurrently. When performed concurrently, the silicon oxynitride layer is removed by an isotropic etch (e.g., a wet etch). The removal of the underlying silicon oxynitride layer erodes the support of masking layer 114, causing the masking layer to be removed as the underlying silicon oxynitride layer is removed. Typically, when photoresist is exposed to high energy ion implantation conditions the photoresist material may become difficult to remove, due to chemical changes which occur during the implantation process. The use of silicon oxynitride layer 112 allows easy removal of masking layer 114.

Figure 10:
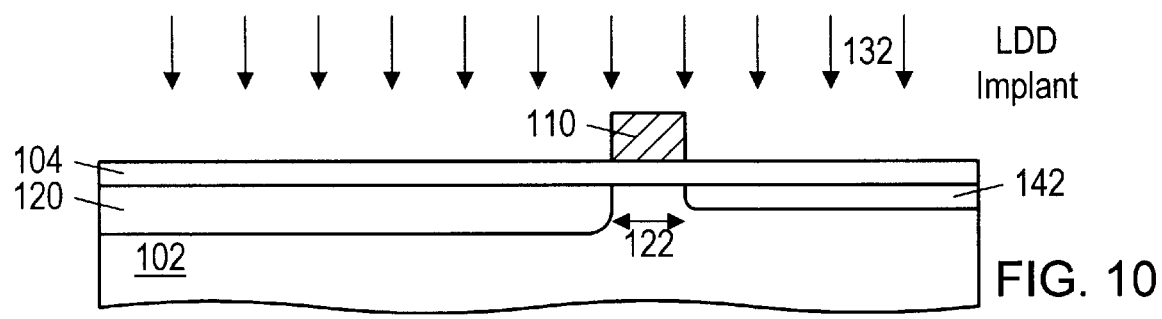
FIG. 10 is a processing step subsequent to FIG. 9, in which an LDD area is formed in the semiconductor substrate.

FIG. 10 illustrates an LDD implant 132 into substrate 102. Gate conductor 110 serves to mask LDD implant 132 from channel region 122. LDD implant 132 is of the same dopant species as the source implant, albeit at a lower concentration and energy than the source implants. Resulting from LDD implant 132, an LDD area 142 is produced. The gate conductor 110 serves to align LDD area 142 adjacent to the gate conductor.

Figure 11:
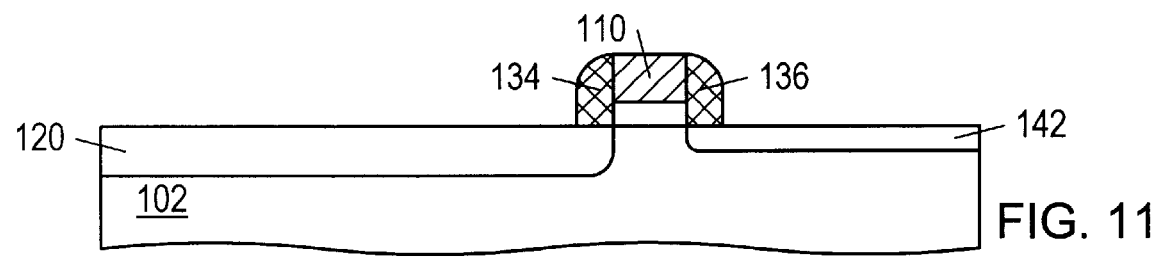
FIG. 11 is a processing step subsequent to FIG. 10, in which spacers are formed on sidewalls of the gate conductor.

FIG. 11 illustrates formation of spacer structures adjacent on sidewalls 116 and 118 of gate conductor 110. After formation of LDD region 142, the exposed portions of dielectric layer 104 are removed by either a dry or wet etch process. The etch conditions are chosen such that the oxide layer is removed with high selectivity against removal of the gate conductor. A spacer material is then conformally deposited across the semiconductor substrate. Spacer material preferably comprises oxide deposited from a CVD apparatus. After deposition, the spacer material preferably undergoes an anisotropic etch. During this etching procedure, the oxide layers on substantially horizontal surface are preferably removed. The only regions of spacer material which remain may be those regions near substantially vertical sidewall surfaces. The remaining regions of material are henceforth referred to as spacers 134 and 136.

Figure 12:
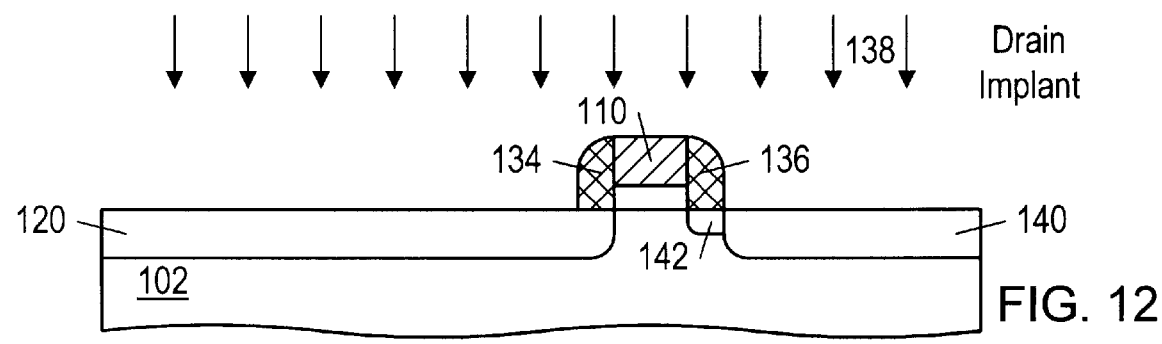
FIG. 12 is a processing step subsequent to FIG. 11, in which a drain region is formed within the semiconductor substrate.

FIG. 12 illustrates a drain implant 138 into substrate 102. Gate conductor 110 and spacers 134 and 136 preferably serve to mask drain implant 138 from channel region 140 and a portion of LDD area 142 under the spacer 136. Drain implant 138 is preferably of the same dopant species as the LDD implant, albeit at a higher concentration and energy than the LDD implant. Resulting from drain implant 138, drain region 140 is produced. Spacer 136 serves to align the drain region 140 a spaced distance from the gate conductor 110.

An advantage of this process is that a transistor having asymmetric LDD structure may be formed. Under typical LDD formation, both the source and the drain of a transistor include LDD areas aligned with the gate conductor. The formation of LDD areas typically helps to reduce hot-carrier effects which may occur in short channel devices. However, a side effect of LDD areas is an increased parasitic resistance of the source and drain regions. The increased parasitic resistance may cause a greater power dissipation for a constant applied voltage. In general, an increased parasitic resistance on the drain side of a transistor does not appreciably effect the drain current when the transistor is operating. However, parasitic resistance at the source side may induce a significant decrease in drain current. The above process allows the separate formation of the source and drain structure. By forming the source and drain structures separately, a transistor having a lightly doped drain region, but no LDD structure in the source region, may be achieved. Thus, problems due to parasitic resistance may be reduced in the formed transistor.

It will be appreciated to those skilled in the art having the benefit of this disclosure that the invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. A method for forming an integrated circuit, comprising:
   patterning a gate conductor a dielectric spaced distance above a semiconductor substrate between a drain region and a source region;
   forming a masking layer over the drain region and a portion of the gate conductor;
   reducing a lateral extent of the gate conductor absent the overlying masking layer;
   maintaining the masking layer above the reduced gate conductor and the drain region and implanting a first dopant distribution into only the source region;
   removing the masking layer subsequent to implanting the first dopant distribution;
   implanting a second dopant distribution into the drain region;
   removing exposed portions of a dielectric layer partially interposed between the gate conductor and the semiconductor substrate;
   forming spacer structures upon sidewalls of the gate conductor; and
   implanting a third dopant distribution into the drain region.

2. The method of claim 1, wherein the lateral length of the gate conductor is reduced below a lateral length obtainable by a photolithographic process.

3. The method of claim 1, further comprising etching the masking layer such that a lateral length of the masking layer is reduced prior to reducing the lateral extents of the gate conductor.

4. The method of claim 3, wherein the masking layer is etched by an isotropic etch.

5. The method of claim 1, wherein reducing the lateral extents of the gate conductor comprises etching an unmasked portion of the gate conductor.

6. The method of claim 3, wherein reducing the lateral extents of the gate conductor comprises etching an unmasked portion of the gate conductor.

7. The method of claim 1, wherein the third dopant distribution is implanted to a depth that is substantially greater than a depth of the second dopant distribution.

8. The method of claim 1, wherein the masking layer comprises a photoresist material.

9. The method of claim 1, wherein the masking layer comprises silicon dioxide.

10. The method of claim 1, wherein the masking layer comprises a photoresist layer formed upon a silicon oxynitride layer.

11. The method of claim 3, wherein the masking layer comprises a photoresist layer formed upon a silicon oxynitride layer, and wherein etching the masking layer comprises:
    isotropically etching the photoresist layer; and
    isotropically etching the silicon oxynitride layer.

12. A method for forming an integrated circuit, comprising:
    patterning a gate conductor a dielectric spaced distance above a semiconductor substrate;
    forming a masking layer over the gate conductor such that a portion of the gate conductor is unmasked;
    removing the unmasked portion of the gate conductor such that a lateral extent of the gate conductor is reduced perpendicular to the elongated axis of the gate conductor;
    implanting a source area into the semiconductor substrate aligned with a first sidewall surface of the reduced gate conductor;
    removing the masking layer;
    implanting a lightly doped drain area into the semiconductor substrate aligned with a second sidewall surface of the reduced gate conductor opposite the first sidewall surface;
    forming spacer structures upon sidewalls of the gate conductor; and
    implanting a drain area into the semiconductor substrate aligned with an outer wall of the spacer structure adjacent to the drain area.

13. The method of claim 12, further comprising etching the masking layer such that an area of the unmasked portion of the gate conductor is increased.

14. The method of claim 13, wherein the masking layer is etched by an isotropic etch.

15. The method of claim 12, wherein the masking layer comprises a photoresist layer formed upon a silicon oxynitride layer.

16. The method of claim 13, wherein the masking layer comprises a photoresist layer formed upon a silicon oxynitride layer, and wherein etching the masking layer comprises:
    isotropically etching the photoresist layer; and
    isotropically etching the silicon oxynitride layer.

17. The method as recited in claim 12, wherein said forming comprises patterning the masking layer such that a lateral sidewall surface of the masking layer extends parallel to and between opposed sidewall surfaces of the gate conductor.

18. The method as recited in claim 12, wherein said forming comprises:
    patterning the masking layer to form an original lateral sidewall surface of the masking layer extending parallel to and between opposed sidewall surfaces of the gate conductor; and
    removing the original lateral sidewall surface to form a subsequent lateral sidewall surface of the masking layer which is configured closer to one of the opposed sidewall surface of the gate conductor than the original lateral surface surface.

19. The method as recited in claim 18, wherein removing the unmasked portion of the gate conductor comprises removing the gate conductor in alignment with the subsequent sidewall surface of the masking layer.

* * * * *